United States Patent Office 3,259,496
Patented July 5, 1966

3,259,496
DIAZO PRESENSITIZED LITHOGRAPHIC PRINTING PLATE COMPRISING INTERMEDIATE LAYER OF HYDROPHILIC METAL FERROCYANIDE AND PROCESS FOR MAKING

Frederick W. von Meister, Peapack, N.J., assignor to Azoplate Corporation, Murray Hill, N.J., a corporation of New Jersey No Drawing. Filed Nov. 27, 1962, Ser. No. 240,425
13 Claims. (Cl. 96—33)

This invention relates to a novel lithographic printing plate.

Photo-mechanical printing plates for flat bed and offset printing have been produced previously by coating a suitable support, e.g., a metal plate or foil, such as aluminum, zinc, paper foils, cellulose acetate foils, with a light hardenable colloidal substance, e.g., albumin, gelatin, fish glue and the like, containing a light-sensitive compound. The printing plate is produced in this process by exposing a light-sensitive layer to an original or master and the resulting image is then developed. It is possible to produce both positive and negative printing plates from a positive original by this method.

More recently, the practice has been to produce the light-sensitive layers without using a colloidal material by coating the foil with a solution of a light-sensitive material itself. If the light-sensitive substance is insoluble in water, organic solvents may be used to prepare the solution. The coating is dried and an image is prepared on the surface of the plate by exposing the light-sensitive layer to light through a transparent original. Thereafter, by treatment with a suitable developer, all areas which are to be hydrophilic, i.e., the non-image areas, are removed, leaving only those areas of the exposed layers which are to be ink receptive, i.e., the image areas. The image areas may be either those areas struck by light, in which case the printing plate having a positive image and producing positive prints may be obtained from a negative master, or the image areas may be those areas not struck by light, in which case the printing plate has a positive image from a positive original. The undesired areas of the originally light-sensitive layer are removed by treating the layer with a suitable developer.

In all planographic printing plates, the surface of the support such as paper, for example, must be hydrophilic in the non-image areas and olephilic in the image areas. Several surface treatments of base materials, such as paper, have been used to satisfy this requirement. Such surfaces are either coatings of cellulose ethers or the like applied directly to the paper or a coating applied over other support coatings, including water resistant coatings. Another approach is the lamination or coating of cellulose acetate, these surfaces being saponified before sensitizing. Still another is a coating of a suitable paper with a dispersion of titanium dioxide in a solution of polyvinyl alcohol and a hardener, which acts as a binder.

In accordance with the present invention, a new presensitized printing plate has been produced in which a suitable base material has a hydrophilic surface thereon which can be sensitized with a water-soluble diazo compound, the light decomposition product of which is oleophilic. The base material may be any suitable support used in electrophotography such as paper, metals, for example, aluminum or zinc, cellulose acetate and the like, having a coating thereon of a hydrophilic metal ferrocyanide. The hydrophilic metal ferrocyanide may be produced in accordance with the teachings of U.S. Patents Numbers 2,952,536, 2,988,988, and 3,001,872. Thus, the coating on the base material, for example, zinc ferrocyanide, may result from the treatment of a zinc oxide dispersion applied to the surface of the base material in a suitable binder, with an acidified solution of potassuim ferro- or ferrocyanide. Alternatively, zinc ferrocyanide suspended in a suitable binder can be applied to the base material directly. As stated in U.S. Patent Number 2,988,988, materials other than zinc oxide such as zinc sulfide, lead oxide, and the like, can be used in the preparation of the hydrophilic coating, and ferrocyanides other than potassium ferrocyanide, such as sodium and calcium ferrocyanide, may be used to form zinc ferrocyanide in situ on the base material. The ferrocyanide solution may be acidified with any of the acids disclosed in the patent such as acetic, oxalic, tartaric, citric, tannic, hydrochloric, nitric, phosphoric and sulfuric acids.

After the formation of the hydrophilic metal ferrocyanide coating on the base material, the surface is washed with water, dried, and sensitized with an aqueous solution of a water-soluble light-sensitive diazo compound.

The surface sensitized in this manner is then exposed under a negative master, such as a photographic film, to a light source rich in ultra-violet radiation and where the light strikes the surface, the diazo compound is decomposed. The light decomposition product is oleophilic and forms the image areas whereas the undecomposed compound, forming the non-image areas, can readily be washed off with water or fountain solution. The oleophilic image areas readily accept ink and, when the plate is clamped into an offset printing machine, it produces copies of good quality.

Among the water-soluble light-sensitive compounds which may be employed are those disclosed, for example, in U.S. Patents Numbers 2,063,631, 2,679,498, and 3,061,429.

The invention will be further illustrated by reference to the following specific examples.

*Example 1*

A paper base, pretreated to prevent the penetration of organic solvents, is coated with a suspension of zinc oxide in a silicone resin binder. The zinc oxide suspension in binder is applied to the base material in solution in a toluene solvent and the surface of the base material so coated is dried at a temperature in the range of 80 to 160° C.

In order to render the surface of the thus coated material hydrophilic, it is treated with the following solution:

100 ml. of acidified 5 percent potassium ferrocyanide solution in water,
0.35 g. of the wetting agent Nekal BX (sodium salt of alkyl naphthalene sulfonate), and
50 ml. of isopropanol.

During this treatment, the zinc oxide coating reacts according to the following equation:

$$2ZnO+Fe(CN)_6''''+4H^+=Zn_2Fe(CN)_6+2H_2O$$

The resulting surface is zinc ferrocyanide, which is hydrophilic. This hydrophilic surface is then sensitized by treatment with a 1.2 percent aqueous solution of the zinc chloride double salt of a condensation product of formaldehyde and diazotized p-aminodiphenylamine.

The sensitized surface is then exposed under a negative master, i.e., a photographic film, to light and the resulting latent image is developed by washing the plate with water, the light-sensitive compound being removed by this treatment. The image areas, being oleophilic, readily accept ink when the plate is clamped into an offset printing machine, and copies of good quality are produced.

*Example 2*

A paper base material, pretreated to prevent the penetration of organic solvents, is coated with the following suspension:

3 parts by weight of polyvinyl alcohol,
1 part by weight of zinc ferrocyanide,
0.5 part by weight of formaldehyde, and
89.5 parts by weight of water.

The coating is dried at a temperature of 95° C. for a period of 15 minutes in a drying oven. The coated base is sensitized, as described in Example 1 above, using as a sensitizer a 2 percent aqueous solution of the zinc chloride double salt of a condensation product of formaldehyde and diazotized p-aminodiphenylamine. After drying the light sensitive coating, an image is produced and developed as described in Example 1.

*Example 3*

To a wet-strength paper of about 70 pounds basic weight (500—24" x 36"), a nitrocellulose lacquer is applied by roll coating to provide a water barrier coat. The lacquered surface is then coated on a roll coater with a suspension of zinc oxide in a toluene solution of silicone resin. The coated paper is dried at a temperature of 250° F. to remove the solvent and leave a continuous layer of zinc oxide in a resin binder in a ratio of 3 parts of zinc oxide to 1 part of resin by weight. The coating weight is 26 pounds per 3,000 square feet.

The surface of the paper thus coated is oleophilic and entirely unsatisfactory for use as a base support for an offset plate and, in order to impart hydrophilic properties to this surface, it was treated for one minute with a 2 percent aqueous solution of potassium ferrocyanide acidified to a pH of 2. A test at this point showed the surface thus treated to be strongly hydrophilic. The surface thus made hydrophilic, was then sensitized by applying with a cotton pad a one percent aqueous solution of a zinc chloride double salt of a condensation product of formaldehyde and diazotitzed p-aminodiphenylamine and allowing the solution to dry at room temperature.

The thus prepared paper plate was exposed to an arc lamp under a film negative and developed with water, which removed the undecomposed diazo compound from those areas not struck by light and left an oleophilic light decomposition product in the image areas. The oleophilic image readily accepts ink and the plate can be used as an offset master.

*Example 4*

A paper base coated with zinc oxide in a binder resin, as described in Example 3 above, was made hydrophilic by first treating the surface with a dilute acid and then with a 5 percent aqueous solution of potassium ferrocyanide. The surface thus treated was then sensitized with a 1.2 percent aqueous solution of the diazonium salt sensitizer used in Example 3 above. After the paper had been dried in air, it was exposed to an arc lamp through a negative and wiped off with a conventional offset fountain solution, containing glycerin and a mixture of phosphate salts, to buffer the solution at a pH of about 6. The resulting image is strongly oleophilic, and the plate can be used for offset printing purposes.

It will be obvious to those skilled in the art that many modifications may be made within the scope of the present invention without departing from the spirit thereof, and the invention includes all such modifications.

What is claimed is:

1. A presensitized printing plate comprising a base material having a first layer thereon comprising a hydrophilic metal ferrocyanide and a second layer comprising a water-soluble, light-sensitive diazo compound.

2. A presensitized printing plate according to claim 1 in which the metal ferrocyanide is zinc ferrocyanide.

3. A presentized printing plate according to claim 1 in which the base material is paper.

4. A presensitized printing plate according to claim 1 in which the base material is metal.

5. A presensitized printing plate according to claim 1 in which the base material is aluminum.

6. A presensitized printing plate according to claim 1 in which the diazo compound is the zinc chloride double salt of a condensation product of diazotized p-aminodiphenylamine and formaldehyde.

7. A process for making a printing plate which comprises exposing a light-sensitive second layer to light under a master and developing the resulting image, the light-sensitive layer comprising a water-soluble, light-sensitive diazo compound and being supported on a first layer comprising a hydrophilic metal ferrocyanide, the first layer being supported on a base material.

8. A process according to claim 7 in which the metal ferrocyanide is zinc ferrocyanide.

9. A process according to claim 7 in which the base material is paper.

10. A process according to claim 7 in which the base material is metal.

11. A process according to claim 7 in which the base material is aluminum.

12. A process according to claim 7 in which the diazo compound is the zinc chloride double salt of a condensation product of diazotized p-aminodiphenylamine and formaldehyde.

13. A process according to claim 7 in which the image is developed with water.

References Cited by the Examiner

UNITED STATES PATENTS

| | | | |
|---|---|---|---|
| 2,154,506 | 4/1939 | Hinman et al. | 96—75 |
| 2,635,537 | 4/1953 | Worthen | 96—33 X |
| 2,714,066 | 7/1955 | Jewett et al. | 96—33 X |
| 2,875,046 | 2/1959 | Marron et al. | 96—33 |
| 2,946,683 | 7/1960 | Mellan et al. | 96—33 X |
| 2,952,536 | 9/1960 | Kurz | 96—33 X |
| 2,957,765 | 10/1960 | Resitich | 96—33 X |
| 2,988,988 | 6/1961 | Kurz | 101—149.2 |
| 3,001,872 | 9/1962 | Kurz | 96—1 |
| 3,106,158 | 10/1963 | Michalchik | 96—33 X |
| 3,113,023 | 12/1963 | Mellan | 96—75 X |
| 3,152,969 | 10/1964 | Eastman | 96—1 X |
| 3,169,065 | 2/1965 | Sorkin et al. | 96—3 |

FOREIGN PATENTS

| | | |
|---|---|---|
| 210,374 | 9/1957 | Australia. |
| 590,766 | 5/1960 | Belgium. |

NORMAN G. TORCHIN, *Primary Examiner.*

ALEXANDER D. RICCI, R. L. STONE, C. BOWERS, *Assistant Examiners.*